(12) United States Patent
Chida et al.

(10) Patent No.: US 8,728,868 B2
(45) Date of Patent: May 20, 2014

(54) SEMICONDUCTOR SUBSTRATE AND METHOD FOR MANUFACTURING SEMICONDUCTOR DEVICE

(71) Applicant: Semiconductor Energy Laboratory Co., Ltd., Atsugi (JP)

(72) Inventors: Akihiro Chida, Atsugi (JP); Yoshiaki Oikawa, Sagamihara (JP); Chiho Kawanabe, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/962,326

(22) Filed: Aug. 8, 2013

(65) Prior Publication Data

US 2013/0344681 A1    Dec. 26, 2013

Related U.S. Application Data

(63) Continuation of application No. 13/165,063, filed on Jun. 21, 2011, now Pat. No. 8,507,322.

(30) Foreign Application Priority Data

Jun. 24, 2010    (JP) ................................ 2010-144127

(51) Int. Cl.
*H01L 21/00*    (2006.01)
(52) U.S. Cl.
USPC ........................................................ 438/118
(58) Field of Classification Search
None
See application file for complete search history.

(56) References Cited

U.S. PATENT DOCUMENTS

| 7,122,445 | B2 | 10/2006 | Takayama et al. |
| 7,229,900 | B2 | 6/2007 | Takayama et al. |
| 7,241,666 | B2 | 7/2007 | Goto et al. |
| 7,452,786 | B2 | 11/2008 | Dozen et al. |
| 7,456,104 | B2 | 11/2008 | Kusumoto et al. |
| 7,465,596 | B2 | 12/2008 | Tsurume et al. |
| 7,510,950 | B2 | 3/2009 | Tsurume et al. |
| 7,591,863 | B2 | 9/2009 | Watanabe et al. |
| 7,632,740 | B2 | 12/2009 | Aoki et al. |
| 7,723,842 | B2 | 5/2010 | Tsurume et al. |
| 7,972,910 | B2 | 7/2011 | Dairiki et al. |
| 2003/0032210 | A1 | 2/2003 | Takayama et al. |
| 2006/0055014 | A1 | 3/2006 | Tsurume et al. |
| 2009/0239320 | A1 | 9/2009 | Takayama et al. |
| 2009/0302456 | A1 | 12/2009 | Oikawa et al. |

FOREIGN PATENT DOCUMENTS

JP    2003-174153    6/2003

*Primary Examiner* — Scott B Geyer

(74) *Attorney, Agent, or Firm* — Eric J. Robinson; Robinson Intellectual Property Law Office, P.C.

(57) ABSTRACT

Provided is a method for manufacturing a semiconductor device, which prevents waste generation from being caused peeling of films and prevents failure of peeling from being caused by waste due to peeling of films. A first semiconductor substrate is used which has a structure in which a peeling layer is not formed in a section subjected to a first dividing treatment, so that the peeling layer is not exposed at the end surface of a second semiconductor substrate when the second semiconductor substrate is cut out of the first semiconductor substrate. In addition, a supporting material is provided on a layer to be peeled of the second semiconductor substrate before the second semiconductor substrate is subjected to a second dividing treatment.

19 Claims, 6 Drawing Sheets

SEMICONDUCTOR SUBSTRATE AND METHOD FOR MANUFACTURING SEMICONDUCTOR DEVICE

BACKGROUND OF THE INVENTION

1. Field of the Invention

The present invention related to a semiconductor substrate and a method for manufacturing a semiconductor device with the use of the semiconductor substrate.

It is to be noted that the semiconductor substrate in this specification refers to a substrate with a semiconductor element or a semiconductor circuit, etc. formed thereon.

2. Description of the Related Art

In recent years, there has been a rapid increase in the demand for flexible semiconductor devices such as flexible electronic paper and solar cells which is able to be placed on curved surfaces. Accordingly, the techniques for manufacturing flexible semiconductor devices have also been attracting a high degree of attention all over the world.

As an example of techniques for manufacturing thin flexible semiconductor devices, a method for manufacturing a flexible semiconductor device has been proposed in which a thin film layer (hereinafter, abbreviated as a layer to be peeled) including the semiconductor device formed on a glass substrate or the like is peeled from the substrate, and transferred to other flexible material, for example, a plastic film (Patent Document 1).

REFERENCE

Patent Document 1: Japanese Published Patent Application No. 2003-174153

SUMMARY OF THE INVENTION

Now then, for the purpose of peeling a layer to be peeled from a substrate with the layer to be peeled formed (hereinafter, abbreviated as a first semiconductor substrate) and transferring the layer to be peeled onto a second substrate with the use of the technique in Patent Document 1, it is desired as one of means for increasing the production efficiency that the size of the first semiconductor substrate is increased to form more semiconductor devices.

This means allows more flexible semiconductor devices to be manufactured from the first semiconductor substrate.

However, with the increase in the size of the first semiconductor substrate, the problem of increased difficulty is caused in dealing with the substrate during the peeling operation or after the peeling operation.

Therefore, before the peeling operation, the first semiconductor substrate is preferably divided into a size which is easy to deal with (hereinafter, the divided first semiconductor substrates are each abbreviated as a second semiconductor substrate).

However, the peeling layer, which is the technique described in Patent Document 1, has intentionally reduced adhesion to the substrate. Therefore, if a dividing treatment is carried out to cut across a section with the peeling layer formed, the peeling layer section will be exposed at the divided surface, and peeling of films will be likely to be caused from the exposed peeling layer section.

For this reason, waste caused by peeling of films generated from the exposed peeling layer section will adhere onto the layer to be peeled during the dividing operation of in a step subsequent to the dividing operation.

The waste adheres onto the layer to be peeled applies a local force partially to the substrate or locally causes a section to which a force is less likely to be applied, when the layer to be peeled is peeled in a subsequent step. Thus, the problem will be more likely to be caused, such as the layer to be peeled partially cracked or unpeeled during the peeling.

While the waste adhering onto the layer to be peeled is removed by adding cleaning such as pulsed jet cleaning (running-water type high-frequency ultrasonic cleaning), it will cause an extra production cost.

In addition, even when the additional cleaning is carried out for the removal of the waste, it is difficult to remove the waste adhering onto the layer to be peeled completely.

The present invention has been made in view of the foregoing technical background. Accordingly, an object of the present invention is to provide a method for manufacturing a semiconductor device which prevents waste generation from being caused by peeling of films and prevents failure of peeling from being caused by waste due to peeling of films.

In order to achieve the object mentioned above, the present invention is focused on the positional relationship between a peeling layer and a layer to be peeled in a first semiconductor substrate. The first semiconductor substrate is configured to have a structure in which the peeling layer is not formed in a section subjected to a dividing treatment (hereinafter, abbreviated as a first dividing treatment), so that the peeling layer is not exposed at the end surface of a second semiconductor substrate when the first semiconductor substrate is subjected to the first dividing treatment to extract the second semiconductor substrate. Thus, during the first dividing treatment and after the dividing treatment, waste can be prevented from being caused by peeling of films from the section of the peeling layer.

In addition, a supporting material is provided on the layer to be peeled of the second semiconductor substrate before applying a dividing treatment for exposing the peeling layer at the end surface of the second semiconductor substrate (hereinafter, abbreviated as a second dividing treatment). Thus, waste caused by film peeling from the section of the peeling layer during the second dividing treatment and after the dividing treatment adheres onto the support material, rather than directly to the layer to be peeled. Therefore, the supporting material serves as a buffer when the layer to be peeled is peeled from the second semiconductor substrate, and failure of peeling is prevented from being caused by waste due to peeling of films.

An aspect of the present invention is a method for manufacturing a semiconductor device, which is characterized in that it includes the steps of: preparing a first semiconductor substrate with a plurality of island-shaped peeling layers formed on a substrate, and a layer to be peeled formed for covering the peeling layers, the layer to be peeled including semiconductor circuits on the peeling layers; applying a first dividing treatment to the first semiconductor substrate along a section including the substrate and the layer to be peeled in contact with each other, thereby producing a second semiconductor substrate including one island-shaped peeling layer and the layer to be peeled covering the peeling layer; providing a peelable supporting material on the layer to be peeled, which is a surface of the produced second semiconductor substrate; applying a second dividing treatment to a section of the second semiconductor substrate, the section including the peeling layer and the layer to be peeled stacked, thereby exposing the peeling layer at an end surface of the second semiconductor substrate, and then peeling the substrate from the layer to be peeled; providing a base material on the surface of the layer to be peeled with the substrate separated therefrom, with an adhesive material interposed therebetween; and peeling the peelable supporting material.

The aspect of the present invention allows for the manufacture of a semiconductor device which prevents waste generation from being caused by peeling of films from the section of the peeling layer and prevents failure of peeling from being caused by waste due to peeling of films.

Furthermore, another aspect of the present invention is a method for manufacturing a semiconductor device, which is characterized in that it includes the steps of: preparing a first semiconductor substrate with a plurality of island-shaped peeling layers formed on a substrate, and a layer to be peeled formed for covering the peeling layers, the layer to be peeled including semiconductor circuits on the peeling layers; applying a first dividing treatment to the first semiconductor substrate along a section including the substrate and the layer to be peeled in contact with each other, thereby producing a second semiconductor substrate including one island-shaped peeling layer and the layer to be peeled covering the peeling layer; providing a peelable supporting material on the layer to be peeled, which is a surface of the produced second semiconductor substrate; applying a second dividing treatment to a section of the second semiconductor substrate, the section including the peeling layer and the layer to be peeled stacked, thereby exposing the peeling layer at an end surface of the second semiconductor substrate, providing a peeling aid substrate on the surface of the second semiconductor substrate without the supporting material provided, with an adhesive material interposed therebetween, and then peeling the substrate from the layer to be peeled; providing a base material substrate on the surface of the layer to be peeled with the substrate separated therefrom, with an adhesive material interposed therebetween; and peeling the peelable supporting material.

The aspect of the present invention allows a peeling force to be applied efficiently to the interface between the peeling layer and the layer to be peeled when the first substrate is peeled, thereby allowing a semiconductor device which prevents failure of peeling from being caused by waste due to peeling of films to be manufactured with a high yield.

In addition, an aspect of the present invention is the method for manufacturing a semiconductor device, in which a material which may have adherence decreased is used as the peelable supporting material.

The aspect of the present invention can prevent adverse effects on the semiconductor circuit, such as film peeling and cracking, which are caused when the supporting material is peeled.

In addition, an aspect of the present invention is the method for manufacturing a semiconductor device, in which as the peelable supporting material, a material is used such that the adhesive force is stronger than the force required for peeling the first substrate from the layer to be peeled, and the adhesive force is weaker than the adhesive material.

The aspect of the present invention eliminates the need to carry out the treatment for reducing the adhesive force of the supporting material, thus allowing a semiconductor device to be manufactured which prevents the semiconductor circuit from being deteriorated.

In addition, an aspect of the present invention is the method for manufacturing a semiconductor device, in which a material which can be dissolved and removed by immersion in a solvent is used as the peelable supporting material.

The aspect of the present invention eliminates the need to apply a physical force for peeling the supporting material, thus allowing a semiconductor device to be manufactured which has no adverse effects on the semiconductor circuit, such as film peeling and cracking which are likely to be caused during the peeling of the supporting material.

It is to be noted that in this specification the semiconductor element refers to a semiconductor group which is not directly responsible for the operation of the semiconductor device (for example, an evaluation element which is used for partially or entirely evaluating the performance of the semiconductor device), whereas the semiconductor circuit refers to a semiconductor group which is directly responsible for the operation of the semiconductor device.

According to the present invention, a semiconductor device can be provided which prevents waste generation from being caused by peeling of films and prevents failure of peeling from being caused by waste due to peeling of films.

DETAILED DESCRIPTION OF THE INVENTION

Figure 1A:
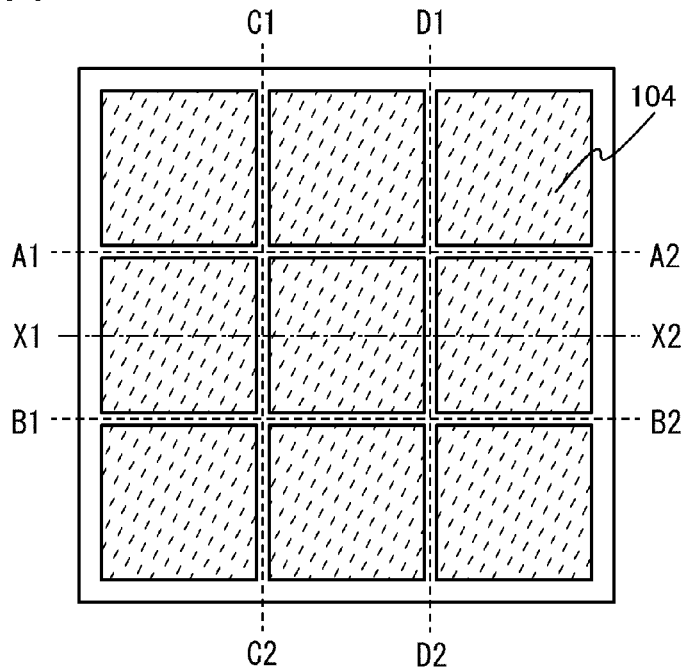
FIGS. 1A to 1C are diagrams illustrating a semiconductor substrate according to the present invention.

Embodiments will be described in detail with reference to the drawings. However, it is to be noted that the invention is not limited to the following description, and it will be easily understood by those skilled in the art that various changes and modifications can be made without departing from the spirit and scope of the invention. Therefore, the invention should not be construed as being limited to the description in the following embodiments. It is to be noted that in the structures according to the invention described below, the same portions or portions which have similar functions are denoted by the same reference numerals through different drawings, and description of such portions will not be repeated.

Embodiment 1

Figure 1B:
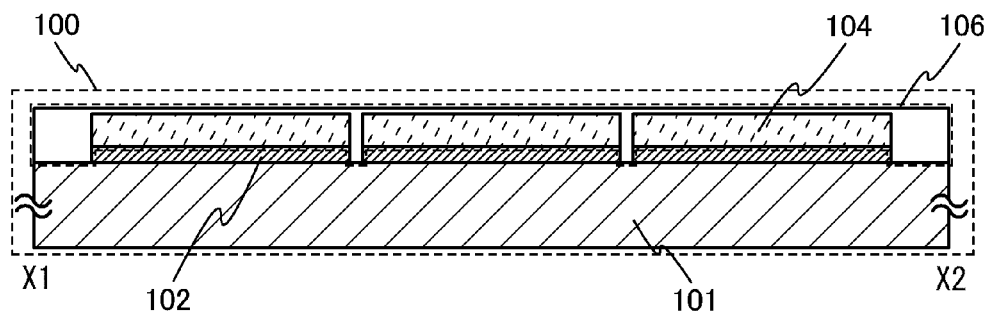
Figure 1C:
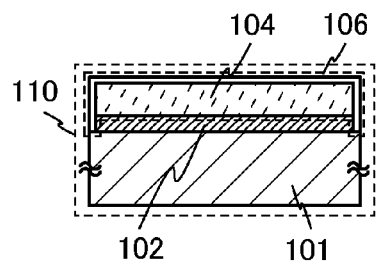

In the present embodiment, the structure of a first semiconductor substrate and the structure of a second substrate will be described with reference to FIGS. 1A to 1C, and a method for manufacturing a semiconductor device with the use of the second semiconductor substrate will be described with reference to FIGS. 2A to 2D and FIGS. 3A to 3E. It is to be noted that FIG. 1A is a top view of a first semiconductor substrate, and FIG. 1B is a cross-sectional view of FIG. 1A along an alternate long and short dash line X1-X2, where a dashed line A1-A2, a dashed line B1-B2, a dashed line C1-C2, and a dashed line D1-D2 indicate dividing lines for cutting a second substrate out of the first substrate. In addition, FIG. 1C is the structure of a second semiconductor substrate cut out of the first substrate of FIG. 1A.

The first semiconductor substrate 100 has, on a substrate 101, a plurality of island-shaped peeling layers 102 formed and a layer to be peeled 106 formed for covering the peeling layers 102. The layer to be peeled 106 includes semiconductor circuits 104 as components for semiconductor devices. It is to be noted that the semiconductor circuits 104 are formed on the peeling layers 102.

It is to be notes that while the section with no peeling layers 102 formed is present in a linear shape in FIG. 1A, the present invention is not to be considered limited to this section. However, when the first semiconductor substrate is subjected to a first dividing treatment in a subsequent step, the section of the substrate 101 in contact with the layer to be peeled 106 (the section with no peeling layers 102 formed) is subjected to the division. Therefore, also in order to carry out the first dividing treatment easily, the section of the substrate 101 in contact with the layer to be peeled 106 is desirably formed in a linear shape.

In addition, the distance between adjacent peeling layers 102 and the distance between an end surface of the substrate 101 and the peeling layer 102 are desirably made small to such an extent that the peeling layer 102 is not exposed from any end surface of the divided substrate (that is, a second semiconductor substrate 110) after the dividing treatment. These small distances can increase the formation area of the semiconductor circuits 104 formed on the peeling layers 102, and thus form the semiconductor circuits efficiently.

The semiconductor circuit 104 has therein at least one semiconductor element (for example, a thin film transistor, a diode, a resistor, a capacitative, etc.) formed, and the layer to be peeled 106 includes the plurality of semiconductor circuits 104.

It is to be noted that while the layer to be peeled 106 has therein only the semiconductor circuits 104 formed as components for semiconductor substrates in the present embodiment, an evaluation element (also referred to as a TEG (Test Element Group)) for checking defective points or making performance evaluations on a semiconductor element (for example, a semiconductor device) may be formed in a region between adjacent peeling layers 102 or in a region between an end surface of the substrate 101 and the peeling layer 102.

The region described above is left on the substrate 101 without being peeled after carrying out a peeling treatment in a subsequent step. Thus, even when the semiconductor element has a damaged point (for example, a scratch caused by bringing a probe into contact with the evaluation element in order to measure electric characteristics) formed, adverse effects on the semiconductor circuits 104 can be suppressed, such as a crack caused and developed from the damaged point.

The substrate 101 is preferably rigid and has such heat resistance that withstands the formations of the peeling layers 102, semiconductor circuits 104, and layer to be peeled 106, because the peeling layers 102 and the layer to be peeled 106 including the semiconductor circuits 104 are formed with the use of various types of film formation systems such as a sputtering system and a CVD system. For example, a glass substrate, a quartz substrate, a metal substrate, a stainless steel substrate, a silicon wafer with an insulating layer formed on a surface thereof, etc. can be used.

It is to be noted that in this specification, a case will be described in which a glass substrate which is easily increased in size and relatively inexpensive is used as the substrate 101.

The peeling layers 102 can be formed from [1] a film containing nitrogen, oxygen, or hydrogen (for example, an amorphous silicon film containing hydrogen, a hydrogen containing alloy film, an oxygen containing alloy film, etc.), [2] a metal film (for example, tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), etc.), [3] an alloy film (an alloy of multiple types of metal elements, such as an alloy of tungsten and molybdenum), and [4] a metal film with a metal oxide formed on a surface thereof or an alloy film with a metal oxide formed on a surface thereof.

Among these films, the peeling layer 102 using [4] the metal film with a metal oxide formed on a surface thereof or the alloy film with a metal oxide formed on a surface thereof is desirable, because the adhesion between the peeling layer 102 and the layer to be peeled 106 is intentionally reduced so that the peeling layer 102 and the layer to be peeled 106 can be peeled from each other by a physical means, and the peeling operation can be thus carried out for short period of time and in safety.

Further, the method for forming a metal oxide at the surface of the peeling layer 102 can include a method of thermally oxidizing the surface of a metal film, a method of processing the surface of a metal film with oxygen or $N_2O$ plasma, and a method of processing the surface of a metal film with a highly oxidative solution such as ozone water. In addition, other methods include a method adapted so that a metal oxide is formed at the interface between the layer to be peeled 106 and the peeling layer 102 when the layer to be peeled 106 is formed. For example, when a film of silicon oxide is formed by a sputtering method, the surface of a metal film or an alloy film is oxidized during the deposition of a silicon oxide on the surface of the metal film or alloy film. It is to be noted that a metal nitride film may be formed by a plasma treatment or a heat treatment, instead of the formation of a metal oxide on the surface of a metal film or an alloy film.

In addition, the peeling layer 102 may be a single layer, or may be formed from multiple layers.

The first semiconductor substrate 100 is subjected to the first dividing treatment along the lines A1-A2, B1-B2, C1-C2, and D1-D2 in FIG. 1A, thereby providing the second semiconductor substrate 110. It is to be noted that the second semiconductor substrate 110 has the peeling layer 102 which is not exposed from any end surface.

For this reason, waste generation can be suppressed which is caused by peeling of films due to the first dividing treatment.

Figure 2A:
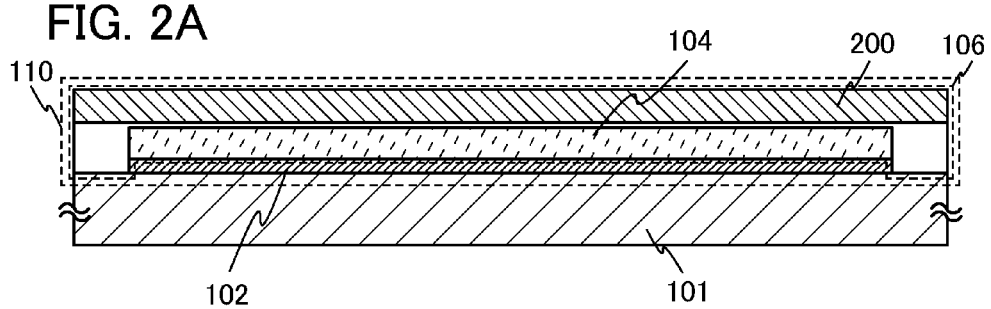
FIGS. 2A to 2D are diagrams illustrating a method for manufacturing a semiconductor substrate according to the present invention.

Next, a supporting material 200 is placed on the layer to be peeled 106 of the second semiconductor substrate 110 (see FIG. 2A).

The supporting material 200 needs to have such adhesion that prevents the supporting material 200 from being easily peeled from the layer to be peeled 106 when the supporting material 200 is placed on the layer to be peeled 106, and to have the property that the supporting material 200 can be easily peeled from the layer to be peeled 106 after a base substrate is attached to the layer to be peeled 106 with an adhesive material interposed therebetween in a subsequent step. As this type of material, for example, a resin or the like can be used which can have adherence decreased by applying a load such as ultraviolet irradiation, heat addition, or electric current.

It is to be noted that while the supporting material 200 is shown as a single layer in FIG. 2A, examples of the supporting material 200 also include a supporting material which has a laminate structure. As the supporting material which has a laminate structure, for example, a tape-shaped material can be used which has a laminate of a resin and a plastic film, in which the resin can have adherence decreased by applying a load such as ultraviolet irradiation, heat addition, or electric current.

In this embodiment, a method for manufacturing a semiconductor device is described for the case of using, as the supporting material 200, a resin which can have adherence decreased by ultraviolet irradiation.

Figure 2B:
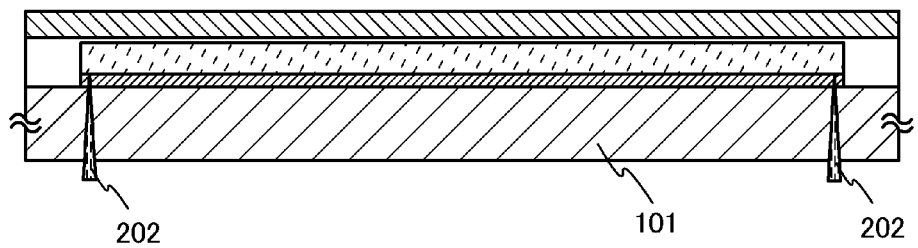
Figure 2C:
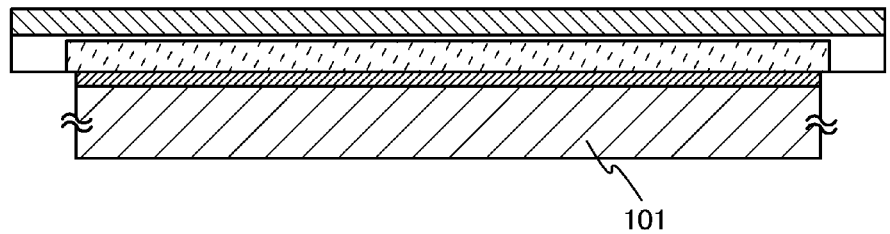

Next, a second dividing treatment is applied to form dividing lines in the section of the peeling layer and layer to be peeled stacked near the peripheral section of the substrate 101 (see FIG. 2B), and separate the substrate 101 outside the dividing lines from the second semiconductor substrate 110 (see FIG. 2C).

It is to be noted that examples of the second dividing treatment include, for example, a method of pressing a blade with a sharp tip 202 against the substrate to cut the substrate as shown in FIG. 2B.

It is to be noted that while the formation of dividing lines is carried out from the rear surface (the side with no layer to be peeled formed) of the substrate 101 in the present embodiment, the present invention is not to be limited to this embodiment. As long as the substrate 101 can be separated without fail after the formation of dividing lines, dividing lines may be formed from the supporting material side.

When the second dividing treatment is carried out, waste (for example, extremely fine glass powder) is generated at the divided points. However, with the supporting material 200 formed on the layer to be peeled 106, even if waste adheres onto the supporting material 200, a local force applied to the layer to be peeled 106 can be relaxed by the supporting material 200 when the substrate 101 is peeled in a subsequent step. For this reason, cracking caused in the layer to be peeled 106 due to waste and defective peeling can be suppressed.

Next, the supporting material 200 side of the substrate 101 is fixed to a fixing jig 204. In this state, an external force is applied to the interface between the peeling layer 102 exposed at the end of the substrate and the layer to be peeled 106. This application of the external force causes one or both of the layer to be peeled 106 and the substrate 101 to undergo a deflection. As a result, a section of the substrate 101 peeled from the layer to be peeled 106 is formed partially or entirely at the substrate periphery with the peeling layer 102 exposed.

Figure 2D:
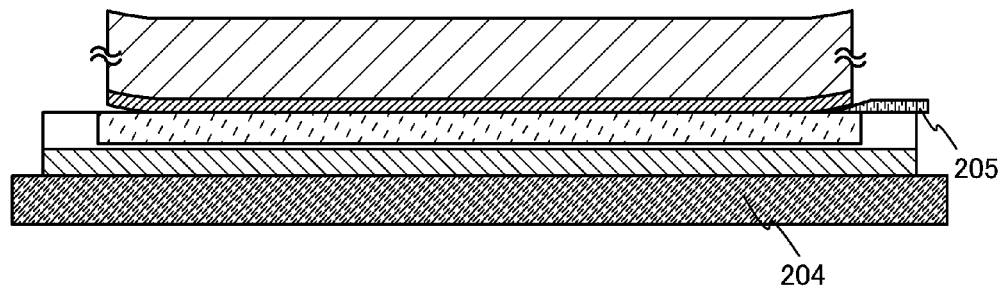

It is to be noted that examples of the external force in the present embodiment include, for example, a method of pressing a blade with a sharp tip 205 against the interface between the peeling layer 102 and the layer to be peeled 106 to apply a force as shown in FIG. 2D.

In addition, as for the fixing jig 204, examples include, for example, a method (also referred to as a porous chuck) for placing an object to be fixed on one surface of a porous pedestal with pores, and carrying out vacuuming from the other surface of the porous pedestal with pores, thereby fixing the object.

The implementation of this treatment can prevent cracking from being caused and developed at the substrate periphery with the peeling layer 102 exposed, when the substrate 101 is peeled entirely from the layer to be peeled 106 in the next step.

Figure 3A:
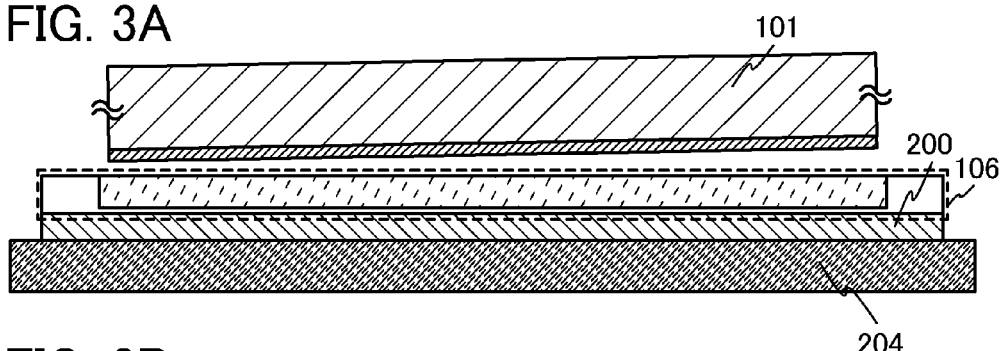
FIGS. 3A to 3E are diagrams illustrating a method for manufacturing the semiconductor substrate.

Next, with, as a starting point, the section with the layer to be peeled 106 peeled by the treatment described above, the substrate 101 is peeled wholly from the layer to be peeled 106 (see FIG. 3A).

Figure 3B:
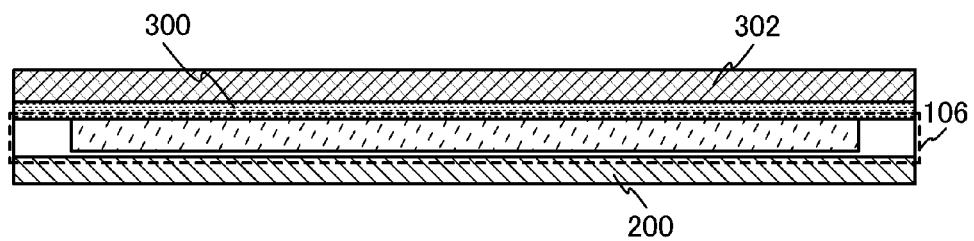

Next, the layer to be peeled 106 with the supporting material 200 formed is separated from the fixing jig 204, and a base material 302 is placed on the side of the layer to be peeled 106 opposite to the side with the supporting material 200 formed, with an adhesive material 300 interposed therebetween (see FIG. 3B).

The adhesive material 300 may be any material as long as the material has such an adhesive force that prevents the layer to be peeled 106 and the base material 302 from being easily peeled from each other after the base material 302 is placed on the layer to be peeled 106 with the adhesive material 300 interposed therebetween.

Further, for the base material 302, for example, glass substrates, silicon wafers, metal plates, various types of plastic substrates, etc. can be used, and preferably, it is desirable to use a flexible material such as glass or a silicon wafer polished into a thin form, a metal thin film, various types of plastic films, prepreg (a structure of a fiber impregnated with an organic resin).

It is to be noted that when a structure of a fiber impregnated with an organic resin, such as prepreg, is used as the base material 302, the adhesive material 300 does not always have to be used because the base material 302 itself contains an adhesive material.

Figure 3C:
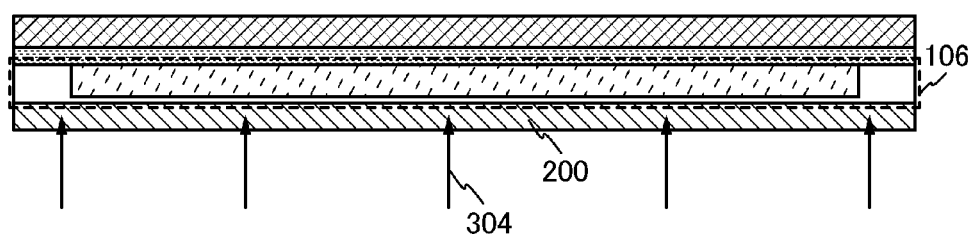

Next, the supporting material 200 is subjected to an adhesion-reducing treatment 304 to reduce the adhesion of the supporting material 200 to such an extent that the supporting material 200 can be peeled easily from the layer to be peeled 106 (see FIG. 3C). It is to be noted that while a resin which can have adherence decreased by ultraviolet irradiation is used as the supporting material 200 in the present embodiment, the adhesion-reducing treatment 304 in FIG. 3C represents an ultraviolet irradiation treatment.

It is to be noted that it is desirable to change the adhesion-reducing treatment 304 appropriately depending on the type of the supporting material used. For example, in the case of using, as the supporting material 200, a material which has adhesion decreased by applying a heat treatment, the adhesion-reducing treatment 304 refers to a "heat treatment".

Figure 3D:
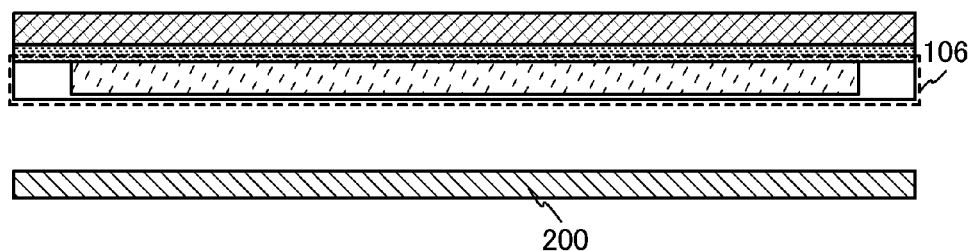

Next, the supporting material 200 is peeled from the layer to be peeled 106 (see FIG. 3D). Thus, a flexible semiconductor device 310 can be manufactured where the layer to be peeled 106 with the semiconductor circuit 104 formed therein responsible for the operation of the semiconductor device is fixed to the base material 302 with the adhesive material 300 interposed therebetween (see FIG. 3E).

The use of the method described above can prevent waste generation from being caused by peeling of films from the peeling layer section during the first dividing treatment, and can prevent defective peeling from being caused by waste due to peeling of films from the peeling layer section during the second dividing treatment.

Thus, a flexible semiconductor device can be manufactured with a high yield.

Further, the present embodiment can be appropriately combined with any of the other embodiments described in this specification.

Embodiment 2

In the present embodiment, in connection with the method for manufacturing a semiconductor device as described in Embodiment 1, a method will be described with reference to FIGS. 4A to 4D for peeling the substrate 101 in a simpler way from the layer to be peeled 106 with the semiconductor circuit 104 formed therein responsible for the operation of the semiconductor device.

Figure 4A:
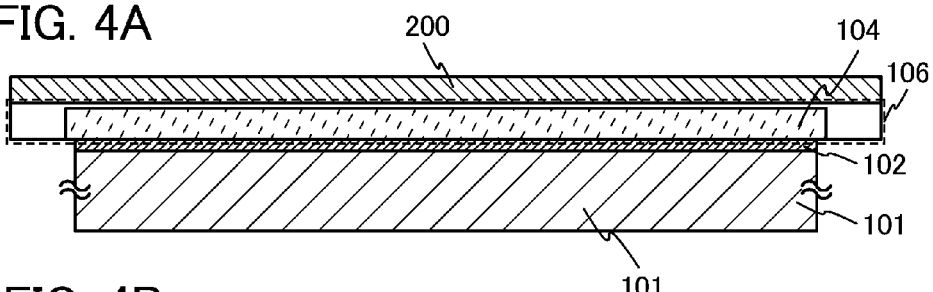
FIGS. 4A to 4D are diagrams illustrating a method for manufacturing the semiconductor substrate.

First, as in the case of Embodiment 1, the second semiconductor substrate 110 is prepared, the supporting material 200 is formed on the layer to be peeled 106, and the second dividing treatment is applied to form dividing lines in the section of the peeling layer and layer to be peeled stacked near the peripheral section of the substrate 101, and separate the section outside the dividing lines (see FIG. 4A).

Figure 4B:
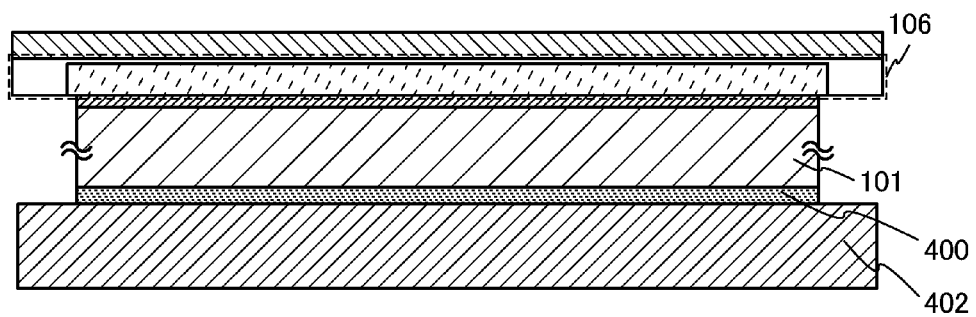

Next, a peeling aid substrate 402 is placed on the surface of the substrate 101 with no layer to be peeled 106 formed, with an adhesive material 400 interposed therebetween (see FIG. 4B)

The adhesive material 400 may be any material as long as the material has such an adhesive force that prevents the substrate 101 and the peeling aid substrate 402 from being easily peeled from each other.

As for the peeling aid substrate 402, when the peeling aid substrate 402 is provided on the substrate 101 with the adhesive material 400 interposed therebetween, at least a portion of the peeling aid substrate 402 is not overlapped with the substrate 101 (protrudes outwardly from the end surface of the substrate 101) desirably.

It is to be noted that the material of the peeling aid substrate 402 is desirably a strongly rigid material. For example, glass substrates, quartz substrates, metal substrates, stainless steel substrates, etc. can be used.

Next, the supporting material 200 is fixed to the fixing jig 204. In this state, an external force is applied to the portion of the peeling aid substrate 402 which is not overlapped with the substrate 101 (the portion protruding outwardly from the end surface of the substrate 101). This application of the external force causes one or both of the layer to be peeled 106 and the substrate 101 to undergo a deflection. As a result, a section of the substrate 101 peeled from the layer to be peeled 106 is formed partially or entirely at the substrate periphery with the peeling layer 102 exposed (see FIG. 4C).

Figure 4C:
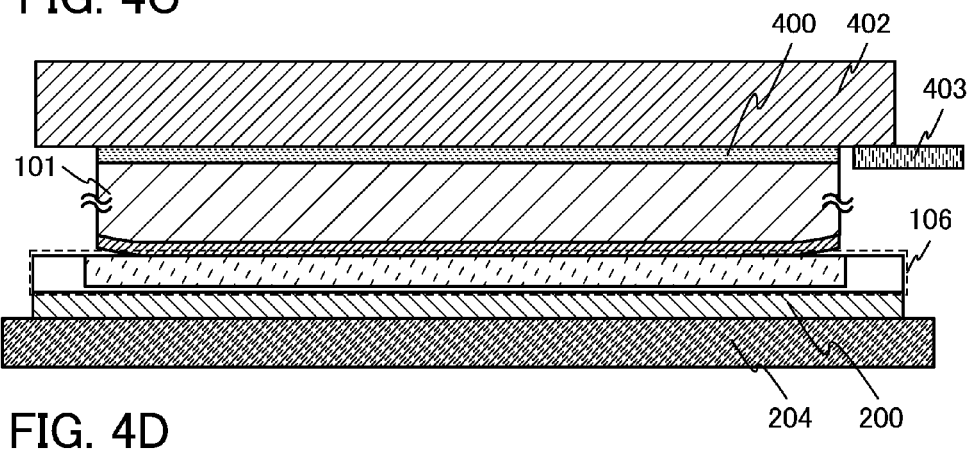

It is to be noted that examples of the external force in the present embodiment include, for example, a method of pressing a plate-like object 403 against the peeling aid substrate 402 to apply a force, as shown in FIG. 4C.

While an external force is applied to the interface between the peeling layer 102 and the layer to be peeled 106 in Embodiment 1, the section to which an external force is applied is not overlapped with the outline of the substrate 101 (protrudes outwardly from the end surface of the substrate 101) in the present embodiment. Thus, an external force can be applied in a simpler way in the present embodiment. In addition, since an external force is applied via the peeling aid substrate 402 to the interface between the peeling layer 102 and the layer to be peeled 106, there is no need to apply an external force directly to the peeling layer 102 and the layer to be peeled 106 (such as to press a blade with a sharp tip directly against the interface between the peeling layer 102 and the layer to be peeled 106 as in FIG. 2D), and the damage to the peeling layer 102 and the layer to be peeled 106 can be thus eliminated.

This application of an external force can peel the substrate 101 from the layer to be peeled 106 in a simpler way.

The implementation of this treatment can prevent cracking from being caused and developed at the substrate periphery with the peeling layer exposed, when the substrate 101 is peeled entirely from the layer to be peeled 106 in the next step.

Figure 4D:
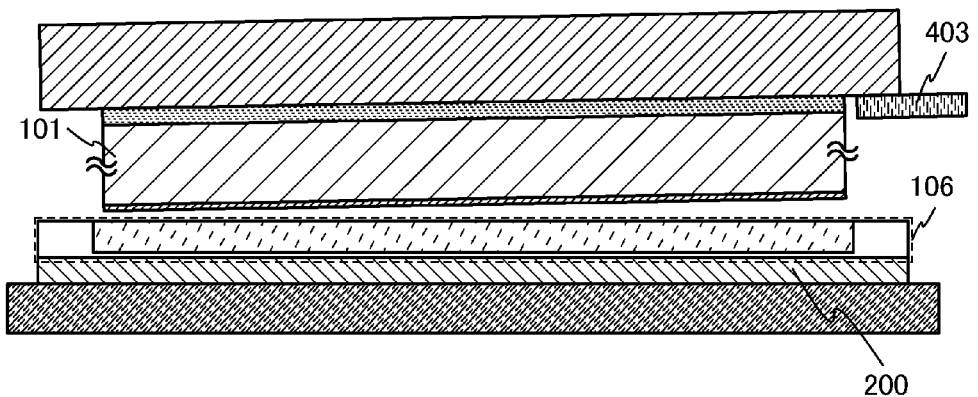

Next, with, as a starting point, the section of the substrate 101 peeled from the layer to be peeled 106, an external force is applied to the interface between the peeling layer 102 and the layer to be peeled 106 with the use of the peeling aid substrate 402 to peel the substrate 101 wholly from the layer to be peeled 106 (see FIG. 4D).

Next, the layer to be peeled 106 with the supporting material 200 formed is separated from the fixing jig 204. After the separation, the base material 302 is placed on the surface of the layer to be peeled 106 with the substrate 101 peeled therefrom, with the adhesive material 300 interposed therebetween. In this state, the supporting material 200 is subjected to the adhesion-reducing treatment 304. This treatment reduces the adhesion at the surface of the supporting material 200 in contact with the layer to be peeled 106, thereby allowing the supporting material 200 to be peeled from the layer to be peeled 106. Therefore, as in the case of FIG. 3E, a flexible semiconductor device 310 can be manufactured.

The use of the method described above can prevent waste generation from being caused by peeling of films from the peeling layer 102 section during the first dividing treatment. In addition, the use of the method can prevent failure of peeling from being caused by waste due to peeling of films from the peeling layer 102 section during the second dividing treatment. Furthermore, the substrate 101 can be peeled from the layer to be peeled 106 in a simpler way.

Thus, a method can be provided for manufacturing a flexible semiconductor device in a simpler way with a high yield.

Further, the present embodiment can be appropriately combined with any of the other embodiments described in this specification.

Embodiment 3

Figure 5A:
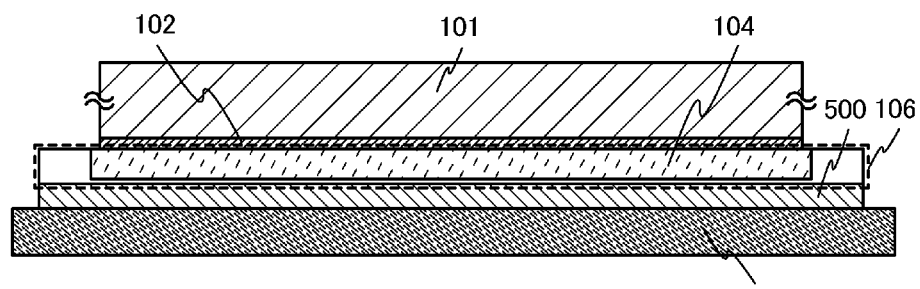
FIGS. 5A to 5C are diagrams illustrating a method for manufacturing the semiconductor substrate.
Figure 5B:
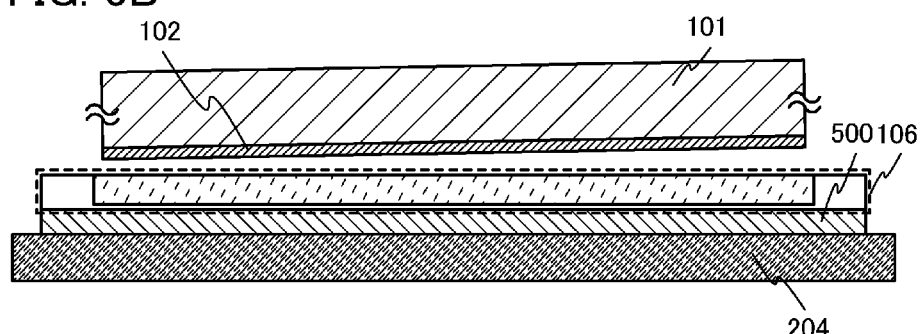

In the present embodiment, in connection with the method for manufacturing a semiconductor device as described in Embodiment 1, a method will be described with reference to FIGS. 5A to 5C for manufacturing a semiconductor device with the use of a different type of supporting material.

In the present embodiment, the second semiconductor substrate 110 is used. The second semiconductor substrate 110 is the same as described in Embodiment 1. On the layer to be peeled 106 of the second semiconductor substrate 110, a supporting material 500 is formed. Then, dividing lines are formed near the peripheral section of the substrate 101. The dividing lines are formed in the section of the peeling layer 102 and layer to be peeled 106 stacked. As the method for forming the dividing lines, for example, a thin blade may be brought into contact with the section while rotating the blade at high speed, a blade with a sharp tip may be pressed against the section, the section may be irradiated with high energy (for example, such as a $CO_2$ laser or a YAG laser beam), or the section may be exposed to a high-pressure liquid (for example, high-pressure water). With the use of the dividing lines formed in the substrate 101, the section outside the dividing lines is separated from the substrate 101. After that, the surface of the substrate 101 with the supporting material 500 formed is fixed in close contact with the fixing jig 204 (see FIG. 5A).

As the supporting material 500, a material is used which has close contact force F per unit area in the range of "f1<F<f2" to the layer to be peeled 106. It is to be noted that the parameter f1 refers to a force per unit area for the external force applied to the interface between the peeling layer 102 and the layer to be peeled 106 when the substrate 101 is peeled from the layer to be peeled 106, and the parameter f2 refers to an adhesive force per unit area at the interface between the adhesive material 300 and the layer to be peeled 106 when the layer to be peeled 106 and the base material 302 are bonded to each other with the adhesive material 300 interposed therebetween in the subsequent step.

Next, an external force is applied to the interface between the peeling layer 102 exposed at the end of the substrate and the layer to be peeled 106. This application of the external force causes one or both of the layer to be peeled 106 and the substrate 101 to undergo a deflection. As a result, a section of the substrate 101 peeled from the layer to be peeled 106 is formed partially or entirely at the substrate periphery. Furthermore, with, as a starting point, the section of the substrate 101 peeled from the layer to be peeled 106, the substrate 101 is peeled wholly from the layer to be peeled 106 (see FIG. 5B).

In this case, the close contact force F (the close contact force per unit area at the interface between the supporting material 500 and the layer to be peeled 106) is greater than the force f1 (the force per unit area for the external force applied in order to peel the substrate 101 from the layer to be peeled 106). For this reason, the substrate 101 can be peeled selectively from the layer to be peeled 106 without the supporting material 500 peeled from the layer to be peeled 106.

Figure 5C:
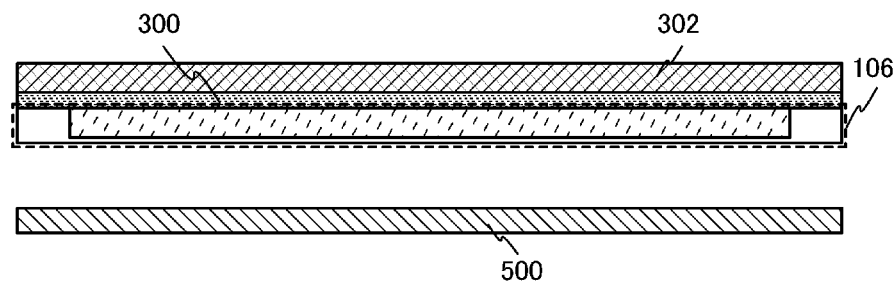

Next, the layer to be peeled 106 with the supporting material 500 formed is separated from the fixing jig 204, the base material 302 is provide on the surface of the layer to be peeled 106 with no supporting material 500 formed, with the adhesive material 300 interposed therebetween, and the supporting material 500 is peeled from the layer to be peeled 106 (see FIG. 5C).

In this case, the close contact force F (the close contact force per unit area at the interface between the supporting material 500 and the layer to be peeled 106) is less than the adhesive force f2 (the adhesive force per unit area at the interface between the adhesive material 300 and the layer to be peeled 106). For this reason, the supporting material 500 can be peeled selectively from the layer to be peeled 106 without the base material 302 peeled from the adhesive material 300.

Figure 3E:
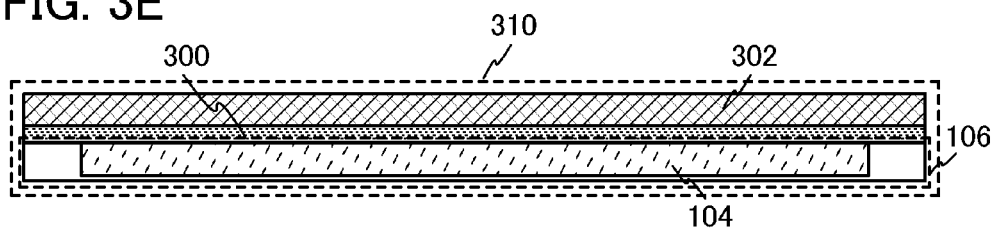

Thus, as in the case of FIG. 3E, the flexible semiconductor device 310 can be manufactured where the layer to be peeled 106 with the semiconductor circuit 104 formed therein responsible for the operation of the semiconductor device is fixed to the base material 302 with the adhesive material 300 interposed therebetween.

The method described above allows a semiconductor device to be manufactured without carrying out any treatment for reducing the close contact force of the supporting material.

Thus, the deterioration of the semiconductor circuit can be suppressed which is caused by the treatment for reducing the close contact force of the supporting material, thereby allowing a semiconductor device with high reliability to be manufactured.

Further, the present embodiment can be appropriately combined with any of the other embodiments described in this specification.

Embodiment 4

In the present embodiment, in connection with the method for manufacturing a semiconductor device as described in Embodiment 1, a method will be described with reference to FIGS. 6A to 6D for manufacturing a semiconductor device with the use of a different type of supporting material.

In the present embodiment, the second semiconductor substrate 110 is used. The second semiconductor substrate 110 is the same as described in Embodiment 1. On the layer to be peeled 106 of the second semiconductor substrate 110, a supporting material 600 is formed. Then, dividing lines are formed near the peripheral section of the substrate 101. The dividing lines are formed in the section of the peeling layer 102 and layer to be peeled 106 stacked. As the method for forming the dividing lines, for example, a thin blade may be brought into contact with the section while rotating the blade at high speed, a blade with a sharp tip may be pressed against the section, the section may be irradiated with high energy (for example, such as a $CO_2$ laser or a YAG laser beam), or the section may be exposed to a high-pressure liquid (for example, high-pressure water). With the dividing lines formed in the substrate 101, the section outside the dividing lines is separated from the substrate 101. After that, the surface of the substrate 101 with the supporting material 600 formed is fixed in close contact with the fixing jig 204.

As the supporting material 600, a material is used which can be dissolved and thereby removed by immersion in a solvent. Examples of this type of material include, for example, a water-soluble adhesive which can be dissolved and thereby removed by immersion in water.

Next, an external force is applied to the interface between the peeling layer 102 exposed at the end of the substrate and the layer to be peeled 106. This application of the external force causes one or both of the layer to be peeled 106 and the substrate 101 to undergo a deflection. As a result, the substrate 101 is peeled from the layer to be peeled 106 partially or entirely at the substrate periphery. Furthermore, with, as a starting point, the section of the substrate 101 peeled from the layer to be peeled 106, the substrate 101 is peeled wholly from the layer to be peeled 106. After that, the layer to be peeled 106 with the supporting material 600 formed is separated from the fixing jig 204. After the separation, the base material 302 is placed on the surface of the layer to be peeled 106 with the substrate 101 peeled therefrom, with an adhesive material 602 interposed therebetween (see FIG. 6B).

It is to be noted that a material which exhibits insolubility to a solvent used is preferably used for the adhesive material 602, because the operation of immersing the supporting material 600 in the solvent to peel the supporting material 600 from the layer to be peeled 106 is carried out in a subsequent step.

Figure 6A:
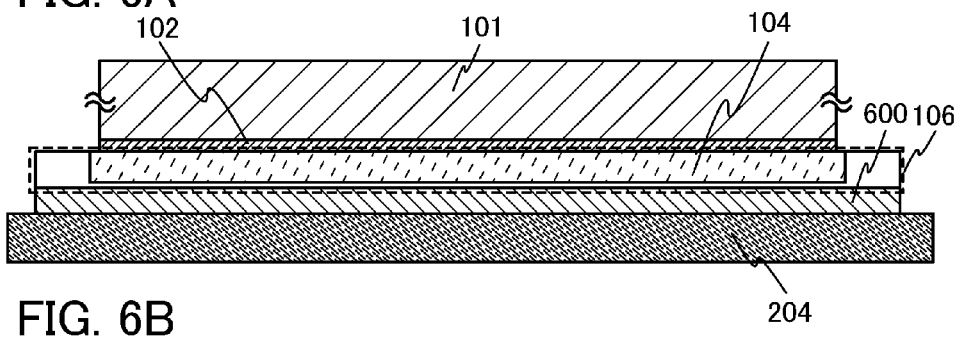
FIGS. 6A to 6D are diagrams illustrating a method for manufacturing the semiconductor substrate.
Figure 6B:
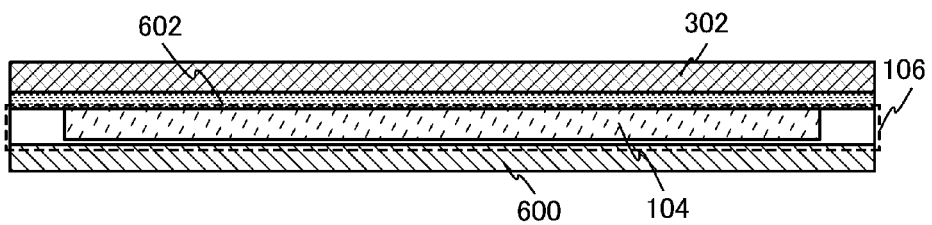
Figure 6C:
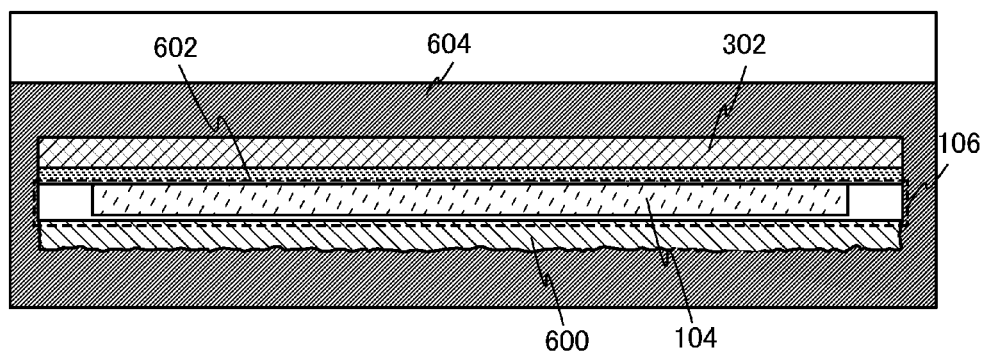

Next, the supporting material 600 and the layer to be peeled 106 with the base material 302 placed with the adhesive material 602 interposed therebetween are immersed in a solvent 604 to dissolve the supporting material 600, thereby removing the supporting material 600 from the layer to be peeled 106 (see FIG. 6C).

Figure 6D:
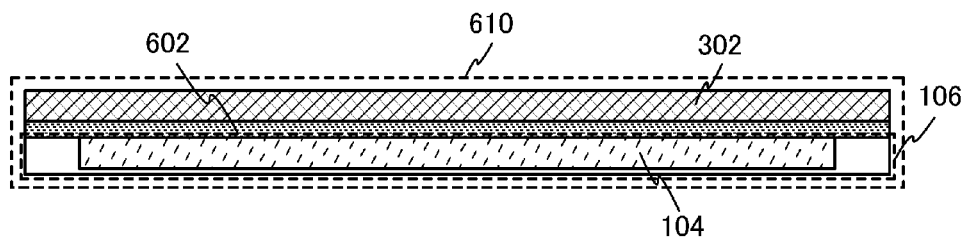

Thus, a flexible semiconductor device 610 can be manufactured where the layer to be peeled 106 with the semiconductor circuit 104 formed therein responsible for the operation of the semiconductor device is fixed to the base material 302 with the adhesive material 602 interposed therebetween (see FIG. 6D).

The method described above allows a semiconductor device to be manufactured without applying any physical force for peeling the supporting material.

Thus, a high-yield and high-reliability semiconductor device can be manufactured in which the deterioration of the semiconductor circuit is suppressed which is caused by the force applied when the supporting material is peeled.

Further, the present embodiment can be appropriately combined with any of the other embodiments described in this specification.

This application is based on Japanese Patent Application serial no. 2010-144127 filed with Japan Patent Office on Jun. 24, 2010, the entire contents of which are hereby incorporated by reference.

What is claimed is:

1. A method for manufacturing a semiconductor device, the method comprising the steps of:
    forming a first film and a second film on a substrate;
    forming a layer comprising a first circuit on the first film and a second circuit on the second film;
    cutting the substrate and the layer such that the substrate is divided into a first piece of the substrate and a second piece of the substrate and the layer is divided into a first piece of the layer comprising the first circuit and a second piece of the layer comprising the second circuit;

attaching a supporting material on a first surface of the first piece of the layer;

removing an end portion of the first piece of the substrate;

peeling the first piece of the substrate from the first film on a second surface of the first piece of the layer;

attaching a base material on the second surface of the first piece of the layer;

irradiating the supporting material with ultraviolet; and peeling the supporting material from the first surface of the first piece of the layer.

2. The method for manufacturing a semiconductor device according to claim 1, wherein the first piece of the substrate is peeled from the first film while the supporting material is fixed on a porous chuck.

3. The method for manufacturing a semiconductor device according to claim 1, wherein the substrate is a glass substrate.

4. The method for manufacturing a semiconductor device according to claim 1, wherein each of the first film and the second film comprises tungsten.

5. The method for manufacturing a semiconductor device according to claim 1, wherein the first film and the second film are processed with $N_2O$ plasma.

6. The method for manufacturing a semiconductor device according to claim 1, wherein the base material is a plastic film.

7. A method for manufacturing a semiconductor device, the method comprising the steps of:

forming a first film and a second film on a substrate;

forming a layer comprising a first circuit on the first film and a second circuit on the second film;

cutting the substrate and the layer such that the substrate is divided into a first piece of the substrate and a second piece of the substrate and the layer is divided into a first piece of the layer comprising the first circuit and a second piece of the layer comprising the second circuit;

attaching a supporting material on a first surface of the first piece of the layer;

removing an end portion of the first piece of the substrate;

peeling the first piece of the substrate from the first film on a second surface of the first piece of the layer;

attaching a base material on the second surface of the first piece of the layer; and dissolving the supporting material with water.

8. The method for manufacturing a semiconductor device according to claim 7, wherein the first piece of the substrate is peeled from the first film while the supporting material is fixed on a porous chuck.

9. The method for manufacturing a semiconductor device according to claim 7, wherein the substrate is a glass substrate.

10. The method for manufacturing a semiconductor device according to claim 7, wherein each of the first film and the second film comprises tungsten.

11. The method for manufacturing a semiconductor device according to claim 7, wherein the first film and the second film are processed with $N_2O$ plasma.

12. The method for manufacturing a semiconductor device according to claim 7, wherein the base material is a plastic film.

13. A method for manufacturing a semiconductor device, the method comprising the steps of:

forming a first film and a second film on a substrate;

forming a layer comprising a first circuit on the first film and a second circuit on the second film;

cutting the substrate and the layer such that the substrate is divided into a first piece of the substrate and a second piece of the substrate and the layer is divided into a first piece of the layer comprising the first circuit and a second piece of the layer comprising the second circuit;

attaching a supporting material on a first surface of the first piece of the layer;

removing an end portion of the first piece of the substrate;

peeling the first piece of the substrate from the first film on a second surface of the first piece of the layer;

attaching a base material on the second surface of the first piece of the layer;

heating the supporting material; and peeling the supporting material from the first surface of the first piece of the layer.

14. The method for manufacturing a semiconductor device according to claim 13, wherein the first piece of the substrate is peeled from the first film while the supporting material is fixed on a porous chuck.

15. The method for manufacturing a semiconductor device according to claim 13, wherein the substrate is a glass substrate.

16. The method for manufacturing a semiconductor device according to claim 13, wherein each of the first film and the second film comprises tungsten.

17. The method for manufacturing a semiconductor device according to claim 13, wherein the first film and the second film are processed with $N_2O$ plasma.

18. The method for manufacturing a semiconductor device according to claim 13, wherein the base material is a plastic film.

19. A method for manufacturing a semiconductor device, the method comprising the steps of:

forming a first film and a second film on a substrate;

forming a layer comprising a first circuit on the first film and a second circuit on the second film;

cutting the substrate and the layer such that the substrate is divided into a first piece of the substrate and a second piece of the substrate and the layer is divided into a first piece of the layer comprising the first circuit and a second piece of the layer comprising the second circuit;

attaching a supporting material on a first surface of the first piece of the layer;

removing an end portion of the first piece of the substrate;

peeling the first piece of the substrate from the first film on a second surface of the first piece of the layer; and attaching a base material on the second surface of the first piece of the layer.

* * * * *